(12) United States Patent
Lai et al.

(10) Patent No.: US 12,364,057 B2
(45) Date of Patent: Jul. 15, 2025

(54) MICRO LED DISPLAY DEVICE

(71) Applicant: PlayNitride Display Co., Ltd., MiaoLi County (TW)

(72) Inventors: Yu-Hung Lai, MiaoLi County (TW); Yun-Li Li, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 18/496,949

(22) Filed: Oct. 30, 2023

(65) Prior Publication Data

US 2024/0063330 A1    Feb. 22, 2024

Related U.S. Application Data

(62) Division of application No. 17/111,451, filed on Dec. 3, 2020, now Pat. No. 11,843,073.

(Continued)

(30) Foreign Application Priority Data

Aug. 21, 2020 (TW) ................. 109128512

(51) Int. Cl.
*H10H 20/01* (2025.01)
*H01L 25/075* (2006.01)
*H10H 20/821* (2025.01)

(52) U.S. Cl.
CPC ......... *H10H 20/01* (2025.01); *H01L 25/0753* (2013.01); *H10H 20/821* (2025.01)

(58) Field of Classification Search
CPC ..... H01L 33/647; H01L 33/486; H01L 33/62; H01L 25/0753; H01L 2224/45144; H01L 33/54; H01L 2224/48091; H01L 2224/48137; H01L 33/641; H01L 33/60; H01L 27/30; H01L 27/3239; H01L 31/143; H01L 31/162; H01L 33/08; H01L 33/18; H01L 33/24; H01L 51/5032; H01L 25/048; H01L 27/288; H01L 27/32; H01L 33/06; H01L 33/26; H01L 51/0032; H01L 51/50; H01L 2251/50; H01L 51/5068; H01L 51/5084; H01L 51/5296; H01L 2051/0032; H01L 2227/03; H01L 33/382;
(Continued)

(56) References Cited

U.S. PATENT DOCUMENTS

2018/0198020 A1* 7/2018 Lai .............. H01L 27/1259
2019/0013298 A1* 1/2019 Lai .............. H01L 25/0753
(Continued)

*Primary Examiner* — Moin M Rahman
(74) *Attorney, Agent, or Firm* — JCIPRNET

(57) ABSTRACT

A micro LED display device includes a display substrate. The display substrate has a first transfer area and a second transfer area adjacent to each other. Both the first transfer area and the second transfer area include a plurality of pixel areas. The pixel area of the first transfer area includes a first micro light-emitting element arranged in a straight line along a first direction. The pixel area of the second transfer area includes a second micro light-emitting element arranged in another straight line along the first direction. In the first direction, the first micro light-emitting element and the second micro light-emitting element are arranged in a staggered manner. A manufacturing method of a micro LED display device is also provided.

10 Claims, 11 Drawing Sheets

Related U.S. Application Data

(60) Provisional application No. 62/980,441, filed on Feb. 24, 2020.

(58) Field of Classification Search
CPC ... H01L 33/387; H01L 33/504; H01L 33/507; H01L 27/156; H01L 25/167; H01L 33/52–56; H01L 51/448; H01L 51/5209; H01L 27/3262; H01L 27/3258; H01L 27/3248; H01L 27/322; H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5012; H01L 51/5206; H01L 51/5221; H01L 51/56; H01L 27/3244; H01L 2227/323; H01L 24/75; H01L 24/98; H01L 2221/68322; H01L 2221/68354; H01L 2224/75822; H01L 2224/7598; H01L 2924/12041; H01L 21/6835; H01L 24/95; H01L 27/153; H01L 27/3202; H01L 27/3204; H01L 27/3209; H01L 27/3225; H01L 27/3251; H01L 51/525; H01L 51/5287; H01L 2227/32; H01L 2227/326; H01L 2251/5323; H01L 2251/5338; H01L 2251/5353; H01L 2251/56; H01L 2251/566; H01L 29/12041; H01L 29/12044; H10H 20/0145; H10H 20/826–8262; H10H 20/013–0137; H10H 20/824–8252; H10H 20/012–0125; H10H 20/823–8232; H10H 20/0165; H10H 20/817–818; H10H 20/052; H10H 20/814–8142; H10H 20/8312; H10H 20/01; H10H 20/857; H10H 20/032; H10H 20/0364; H10H 20/0363; H10H 20/855; H10H 20/819; H10H 20/856; H10H 20/82; H10H 20/831; H10H 20/821
See application file for complete search history.

(56) References Cited

U.S. PATENT DOCUMENTS

2021/0111324 A1* 4/2021 Chung .................. H01L 33/62
2021/0407830 A1* 12/2021 Ahn ..................... H01L 21/6838

* cited by examiner

MICRO LED DISPLAY DEVICE

CROSS-REFERENCE TO RELATED APPLICATION

This application is a divisional application of and claims the priority benefit of U.S. application Ser. No. 17/111,451 filed on Dec. 3, 2020, now allowed, which claims the priority benefit of U.S. provisional application No. 62/980,441, filed on Feb. 24, 2020, and Taiwan application serial no. 109128512, filed on Aug. 21, 2020. The entirety of each of the above-mentioned patent applications is hereby incorporated by reference herein.

TECHNICAL FIELD

The disclosure relates to a display device and a manufacturing method thereof, and more particularly, to a micro LED display device and a manufacturing method thereof.

BACKGROUND

With advancements in optoelectronic technologies, various optoelectronic elements have been gradually developed trending to volume microminiaturization. In recent years, due to the breakthrough in production size for the light-emitting diode (LED), micro-LED displays made of micro light-emitting diodes arranged in arrays have gradually gained attention in the market.

Further, in the process of transferring micro light-emitting diodes onto a display substrate, thicknesses of the micro light-emitting diodes may not be uniform due to the wafer manufacturing process. Due to a large area fetching during each transfer process, light field distributions of the micro light-emitting diodes in any two adjacent transfer areas may be different, resulting in a brightness difference. Accordingly, when the display substrate is operating, the viewer may perceive that there is a clear boundary between the splicing points of any two adjacent transfer areas, and thus there is a problem of poor display quality.

SUMMARY

The disclosure provides a micro LED display device and a manufacturing method thereof, which can provide good display quality.

A manufacturing method of a micro LED display device of the disclosure at least includes the following steps. A plurality of micro light-emitting diodes are picked up by a transfer head. The micro light-emitting diodes are transferred and bonded onto a display substrate. The display substrate has two transfer areas adjacent to each other. Transfer steps include: (a) moving the transfer head above one of the two transfer areas, and transferring a part of the plurality of micro light-emitting diodes onto one of the two transfer areas; (b) moving the transfer head above the other one of the two transfer areas with the transfer head correspondingly having a rotation of 180 degrees; and (c) transferring another part of the plurality of micro light-emitting diodes onto the other one of the two transfer areas, the micro light-emitting diodes located in one of the two transfer areas and the micro light-emitting diodes located in the other one of the two transfer areas are arranged in a staggered manner.

In an embodiment of the disclosure, the micro light-emitting diodes includes a plurality of first color light micro light-emitting diodes, a plurality of second color light micro light-emitting diodes or a plurality of third color light micro light-emitting diodes, and the step (a) to the step (c) are repeated so that one of the two transfer areas includes at least one of the first color light micro light-emitting diodes, at least one of the second color light micro light-emitting diodes and at least one of the third color light micro light-emitting diodes and the other one of the two transfer areas includes at least one of the first color light micro light-emitting diodes, at least one of the second color light micro light-emitting diodes and at least one of the third color light micro light-emitting diodes.

In an embodiment of the disclosure, the first color light micro light-emitting diode, the second color light micro light-emitting diode and the third color light micro light-emitting diode located in one of the two transfer areas are arranged in a straight line along a first direction, and the first color light micro light-emitting diode, the second color light micro light-emitting diode and the third color light micro light-emitting diode located in the other one of the two transfer areas are arranged in another straight line along the first direction. In the first direction, the first color light micro light-emitting diode located in one of the two transfer areas does not overlap with the first color light micro light-emitting diode located in the other one of the two transfer areas.

In an embodiment of the disclosure, the transfer head has a first edge and a second edge arranged side by side, and in the step (a) and the step (c), the first edge overlaps with a boundary between one of the two transfer areas and the other one of the two transfer areas.

In an embodiment of the disclosure, in the step (b), the rotation of the transfer head is completed before or after the transfer head is moved above the other one of the two transfer areas.

In an embodiment of the disclosure, an area of the transfer head is equal to an area of any one of the transfer areas.

In an embodiment of the disclosure, the transfer head is configured to pick up M×N of the micro light-emitting diode, and M≥2N.

The disclosure provides a micro LED display device, in which a display substrate has a first transfer area and a second transfer area adjacent to each other. Both the first transfer area and the second transfer area include a plurality of pixel areas. At least one of the pixel areas of the first transfer area includes a first micro light-emitting element arranged in a straight line along a first direction. At least one of the pixel areas of the second transfer area includes a second micro light-emitting element arranged in another straight line along the first direction. In the first direction, the first micro light-emitting element and the second micro light-emitting element are arranged in a staggered manner, and the first micro light-emitting element and the second micro light-emitting element have a same color light.

In an embodiment of the disclosure, the micro LED display device further includes a common electrode line. The common electrode line is disposed on the display substrate, and extends through the first transfer area and the second transfer area along the first direction. In an embodiment of the disclosure, both the first micro light-emitting element and the second micro light-emitting element include a first-type electrode and a second-type electrode, and the first-type electrode of the first micro light-emitting element and the first-type electrode of the second micro light-emitting element are bonded to the common electrode line.

In an embodiment of the disclosure, the micro LED display device further includes a plurality of pixel electrodes disposed in the first transfer area and the second transfer area. Each of the pixel electrodes includes a top electrode and a bottom electrode, and in a second direction perpendicular to the first direction, the top electrode and the bottom electrode are located on two sides of the common electrode line.

In an embodiment of the disclosure, two ends of the first micro light-emitting element are respectively bonded to the common electrode line and the top electrode of the pixel electrode in the first transfer area, and two ends of the second micro light-emitting element are respectively bonded to the common electrode line and the bottom electrode of the pixel electrode in the second transfer area.

In an embodiment of the disclosure, the micro LED display device further includes a first common electrode line, a second common electrode line and a plurality of pixel electrodes disposed on the display substrate. The first common electrode line is parallel to the second common electrode line. The first common electrode line and the second common electrode line extend through a first transfer area and a second transfer area along the first direction. The pixel electrodes are disposed in an array in the first transfer area and the second transfer area. Each of the pixel electrodes is located between the first common electrode line and the second common electrode line, and each of the pixel electrodes includes a top electrode extending toward the first common electrode line and a bottom electrode extending toward the second common electrode line.

In an embodiment of the disclosure, two ends of the first micro light-emitting element are respectively bonded to the second common electrode line and the bottom electrode of the pixel electrode in the first transfer area, and two ends of the second micro light-emitting element are respectively bonded to the first common electrode line and the top electrode of the pixel electrode in the second transfer area.

In an embodiment of the disclosure, the first common electrode line and the second common electrode line are arranged along a second direction perpendicular to the first direction.

In an embodiment of the disclosure, the display substrate further includes a third transfer area and a fourth transfer area respectively adjacent to the first transfer area and the second transfer area in a second direction perpendicular to the first direction, and a boundary between the third transfer area and the fourth transfer area is offset from a boundary between the first transfer area and the second transfer area in the first direction.

In an embodiment of the disclosure, the third transfer area includes a third micro light-emitting element, and the third micro light-emitting element is aligned with the second micro light-emitting element in the second direction.

In an embodiment of the disclosure, the second micro light-emitting element and the third micro light-emitting element are plural in numbers, and at least one of the third micro light-emitting elements is aligned with at least one of the second micro light-emitting elements in the second direction.

In an embodiment of the disclosure, both the second transfer area and the third transfer area include a plurality of pixel areas, and at least one of the pixel areas in the second transfer area is aligned with at least one of the pixel areas in the third transfer area in the second direction.

Based on the above, according to the transfer steps of the disclosure, by rotating the transfer head 180 degrees when the transfer head is moved from one transfer area to another transfer area, the micro light-emitting diodes may be transferred onto predetermined positions more accurately to form a mutual staggered manner. In this way, the obvious boundary caused by the thickness difference of the micro light-emitting diodes at both ends of the transfer head due to the wafer process factors may be reduced, and the brightness difference between the adjacent transfer areas may be compensated. Therefore, the display substrate can provide good display quality when working.

To make the aforementioned more comprehensible, several embodiments accompanied with drawings are described in detail as follows.

DETAILED DESCRIPTION

Figure 1:
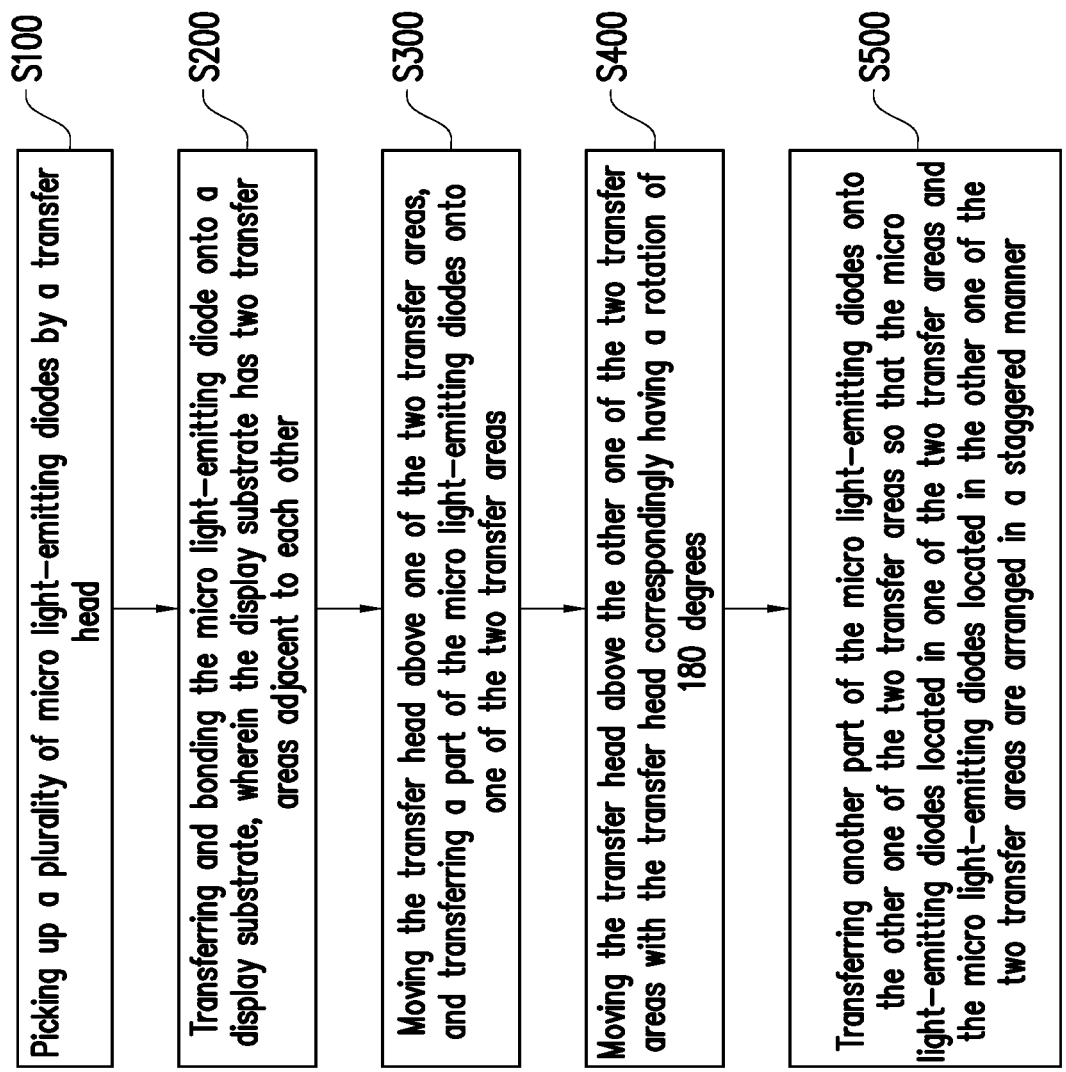
FIG. 1 is a flowchart illustrating a manufacturing method of a micro LED display device according to an embodiment of the disclosure.

FIG. 1 is a flowchart illustrating a manufacturing method of a micro LED display device according to an embodiment of the disclosure. FIG. 2A to FIG. 2F are partial schematic diagrams illustrating the manufacturing method of the micro LED display device according to an embodiment of the disclosure.

In this embodiment, the manufacturing method of a micro LED display device 100 may include the following steps. It should be noted that, as shown in FIG. 2F, for clarity, each of the following embodiments only describes a partial enlarged part of the micro LED display device 100.

Figure 2A:
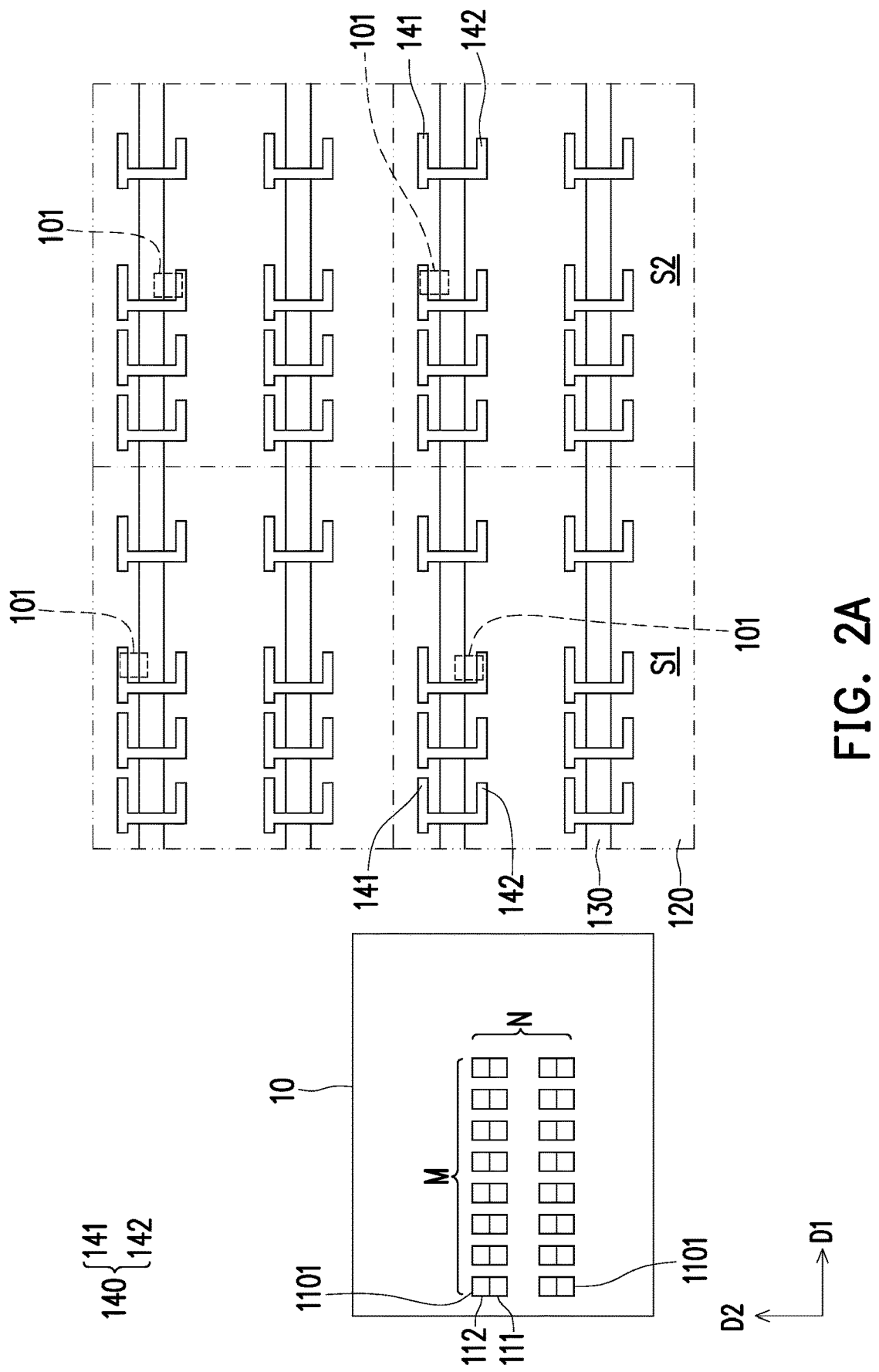
FIG. 2A to FIG. 2F are partial schematic diagrams illustrating the manufacturing method of the micro LED display device according to an embodiment of the disclosure.

Referring to FIG. 1 and FIG. 2A together, first of all, in a step S100, a plurality of micro light-emitting diodes are picked up by a transfer head 10. FIG. 2A schematically shows sixteen micro light-emitting diodes 1101.

In this embodiment, each of the micro light-emitting diodes 1101 may include a first-type electrode 111 and a second-type electrode 112, wherein electrical properties of the first type electrode 111 and the second type electrode 112 may be different from each other. For example, in an embodiment, the first-type electrode 111 and the second-type electrode 112 may be a combination of a p-type electrode and an n-type electrode, but the disclosure is not limited thereto. In another embodiment, the first-type electrode 111 and the second-type electrode 112 may be a combination of an n-type electrode and a p-type electrode.

In an embodiment, the micro light-emitting diodes 1101 may be arranged in an array on an adsorption surface of the transfer head 10. For example, the micro light-emitting diodes 1101 may be arranged in a rectangular array on the adsorption surface of the transfer head 10, such that when the transfer head 10 is rotated 180 degrees later, the micro light-emitting diodes on a boundary of adjacent transfer areas can have similar thicknesses, so as to improve the problem of poor thickness uniformity on the wafer. The rectangular array is preferably arranged in an M×N arrangement. More preferably, M≥2N, M and N are positive integers, but the disclosure is not limited thereto, an array size of the micro light-emitting diodes may be determined according to actual design requirements.

In an embodiment, the adsorption surface of the transfer head 10 may be a side of the transfer head 10 facing down, therefore, the micro light-emitting diodes 1101 may be covered by the transfer head 10. Here, FIG. 2A is illustrated in a perspective manner.

In an embodiment, the first-type electrode 111 in each of the micro light-emitting diodes 1101 may be located on a lower part of the transfer head 10, and the second type electrode 112 may be located on an upper part of the transfer head 10, but the disclosure is not limited thereto.

In an embodiment, the micro light-emitting diodes on a growth substrate may be picked up for transfer through the vacuum, magnetic attraction or electrostatic force of the transfer head 10, wherein the growth substrate is, for example, an epitaxial substrate. However, the disclosure is not limited thereto, the transfer head 10 may also pick up the micro light-emitting diodes for transfer by other suitable methods.

In some embodiments, the micro light-emitting diode 1101 is, for example, a first color light micro light-emitting diode, a second color light micro light-emitting diode or a third color light micro light-emitting diode. For example, the first color light micro light-emitting diode may be a red micro light-emitting diode; the second color light micro light-emitting diode may be a green micro light-emitting diode; and the third color light micro light-emitting diode may be a blue micro light-emitting diode. However, the disclosure is not limited thereto. The first color light micro light-emitting diode, the second color light micro light-emitting diode and the third color light micro light-emitting diode may be selected according to actual design requirements, so as to select a corresponding color light combination for achieving required sub-pixel in the subsequent configuration.

Figure 2B:
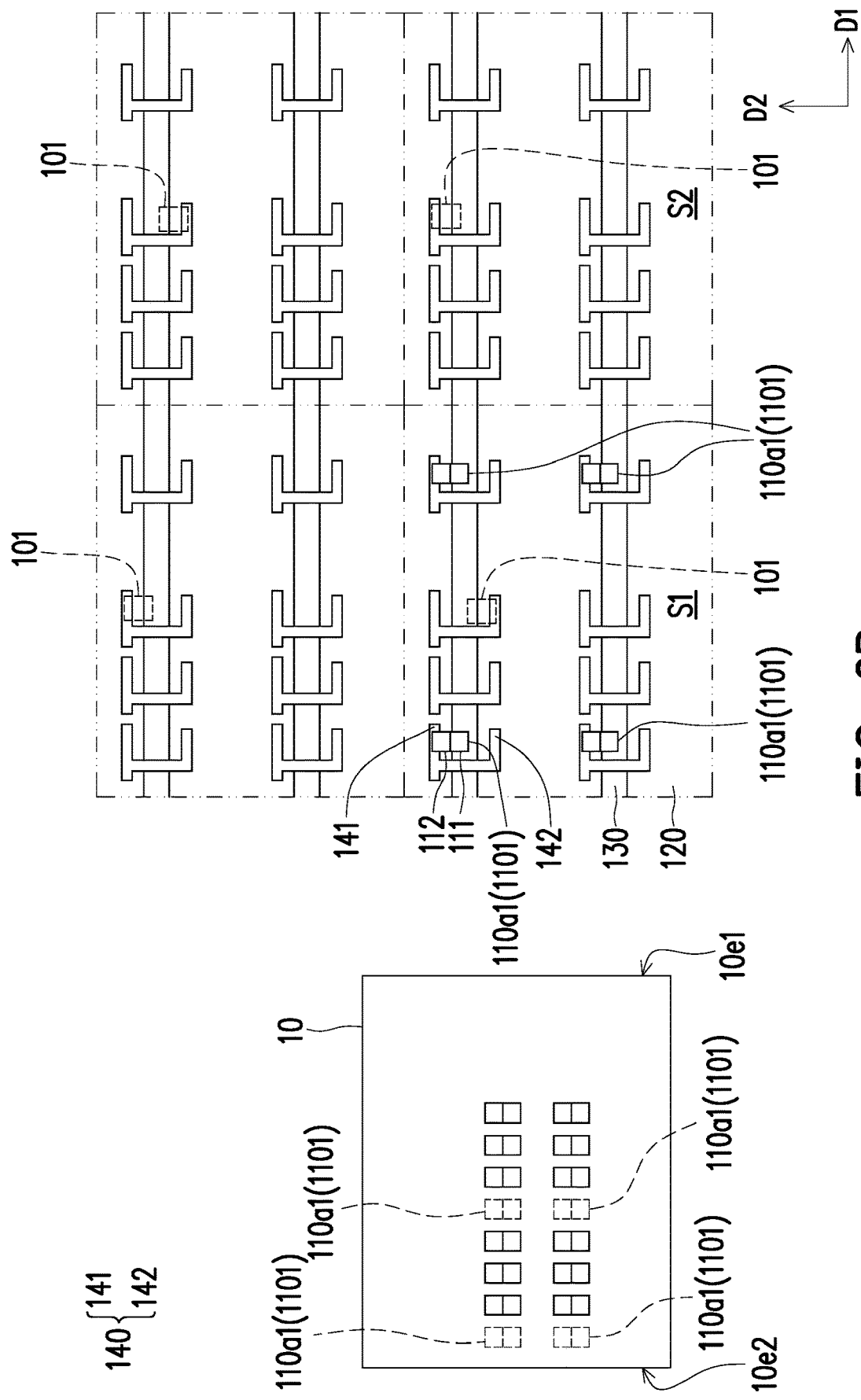

Referring to FIG. 1, FIG. 2A and FIG. 2B together, in a step S200, the micro light-emitting diodes 1101 are transferred and bonded onto a display substrate 120, wherein the display substrate 120 has two transfer areas adjacent to each other. For example, the micro light-emitting diodes 1101 are transferred and bonded onto the display substrate 120 in a first transfer area S1 and a second transfer area S2 adjacent to each other, wherein the first transfer area S1 and the second transfer area S2 are adjacent to each other in a first direction D1, but the disclosure is not limited thereto. In an embodiment, the display substrate 120 is, for example, a TFT (Thin Film Transistor) array substrate, but the disclosure is not limited thereto.

The display substrate 120 may include a common electrode line 130 and a plurality of pixel electrodes 140. In this embodiment, the common electrode line 130 may extend through the first transfer area S1 and the second transfer area S2 along the first direction D1, and the pixel electrodes 140 may be disposed in the first transfer area S1 and the second transfer area S2. In addition, each of the pixel electrodes 140 in the first transfer area S1 and the second transfer area S2 may include a top electrode 141 and a bottom electrode 142, and in a second direction D2, the top electrode 141 and the bottom electrode 142 may be located on two sides of the common electrode line 130, wherein the second direction D2 is perpendicular to the first direction D1. However, the disclosure is not limited thereto. In other embodiments, the pixel electrode and the common electrode line may also have other configurations based on design requirements.

In this embodiment, transfer steps may include at least the following process. First, in a step S300, the transfer head 10 is moved above one of the two transfer areas, and a part of the micro light-emitting diodes 1101 is transferred onto one of the two transfer areas. For example, the transfer head 10 may be moved above the first transfer area S1, and a part of the micro light-emitting diodes 1101 (micro light-emitting diodes 110*a*1) may be transferred onto the first transfer area S1. For example, a dotted line portion of the micro light-emitting diode 110*a*1 of the transfer head 10 in FIG. 2B is transferred onto a solid line portion of the first transfer area S1 as the micro light-emitting diode 110*a*1 therein.

Figure 2C:
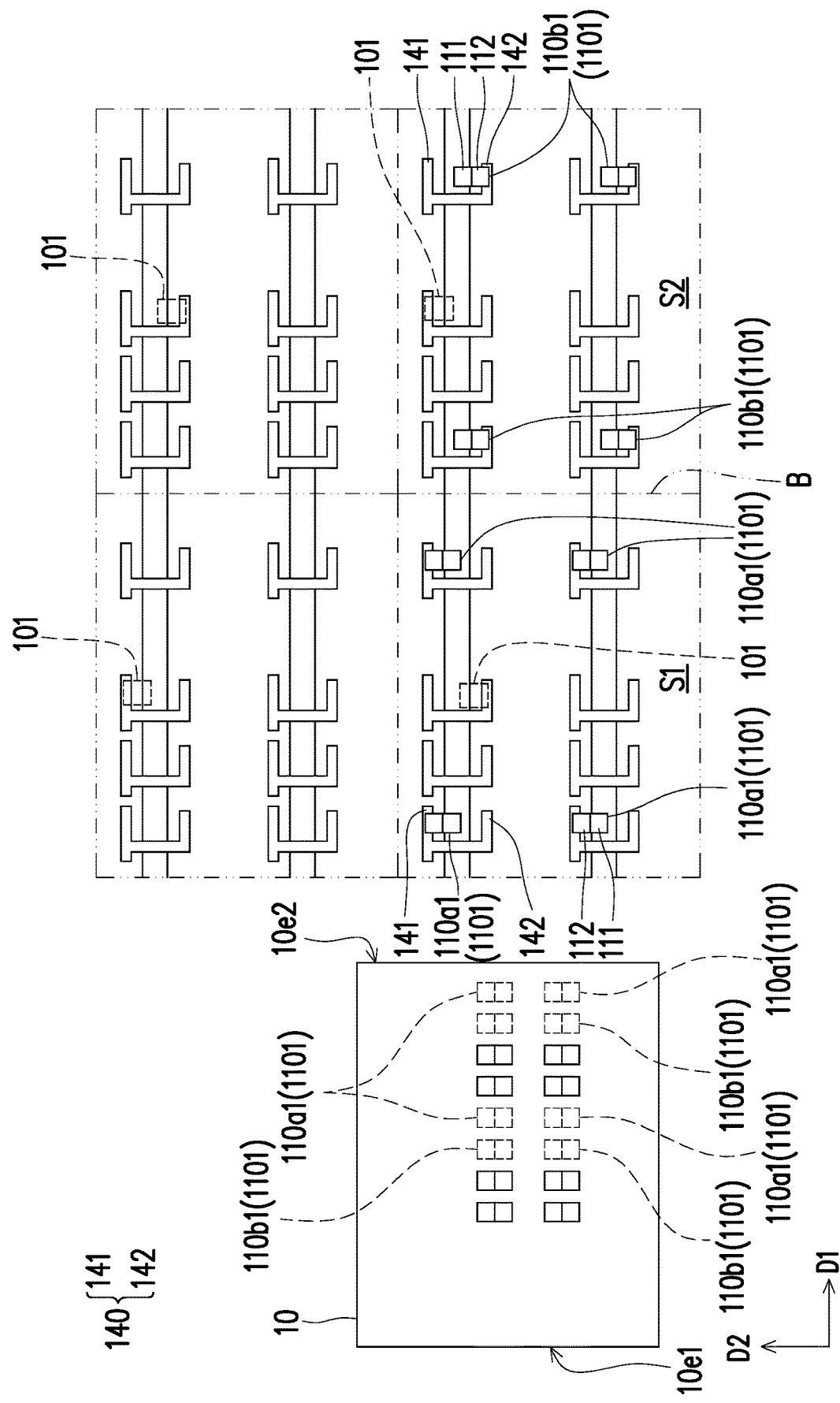

Referring to FIG. 1, FIG. 2B and FIG. 2C together, in a step S400, the transfer head 10 is moved above the other one of the two transfer areas with the transfer head correspondingly having a rotation of 180 degrees. For example, the transfer head 10 may be correspondingly rotated on top of the second transfer area S2 in rotation of 180 degrees. The rotation is, for example, a clockwise rotation or a counterclockwise rotation. Then, in a step S500, another part of the micro light-emitting diodes 1101 is transferred onto the other one of the two transfer areas, the micro light-emitting diodes located in one of the two transfer areas and the micro light-emitting diodes located in the other one of the two transfer areas are arranged in a staggered manner. For example, another part of the micro light-emitting diodes 1101 (micro light-emitting diodes 110*b*1) may be transferred onto the second transfer area S2, the micro light-emitting diode 110*a*1 located in the first transfer area S1 is staggered to the micro light-emitting diode 110*b*1 in the second transfer area S2.

Accordingly, in the transfer steps of this embodiment, when the transfer head 10 is moved from one transfer area (the first transfer area S1) to the other transfer area (the second transfer area S2), by rotating the transfer head 10 by 180 degrees, required micro light-emitting diodes (the micro light-emitting diode 110*a*1 and the micro light-emitting diode 110*b*1) can be accurately transferred onto the predetermined positions to form the mutual staggered manner. In this way, the obvious boundary caused by the thickness difference of the micro light-emitting diodes at both ends of the transfer head due to the wafer process factors may be reduced, and the brightness difference between the adjacent transfer areas (the first transfer area S1 and the second transfer area S2) may be compensated. Therefore, the display substrate 120 can have good display quality when working. Furthermore, since the difference between adjacent micro light-emitting diodes is the smallest, after the transfer head 10 has picked up several micro light-emitting diodes on the wafer, it can be seen that the micro light-emitting diodes on left and right ends of the transfer head 10 will have the largest thickness difference. Therefore, by rotating the transfer head 10 by 180 degrees, the micro light-emitting diodes on the boundary of the two adjacent transfer areas can have similar thicknesses, and their photoelectric characteristics will be similar. As a result, good display quality can be provided.

In this embodiment, for example, the aforementioned staggered manner refers to: two ends of the micro light-emitting diode 110*a*1 in the first transfer area S1 (e.g., the first-type electrode 111 and the second-type electrode 112) may be respectively bonded to the common electrode line 130 in the first transfer area S1 and the top electrode 141 of the pixel electrode 140; two ends of the micro light-emitting diode 110*b*1 in the second transfer area S2 (e.g., the first-type electrode 111 and the second-type electrode 112) may be respectively bonded to the common electrode line 130 in the second transfer area S2 and the bottom electrode 142 of the pixel electrode 140. In other words, the first-type electrode 111 of the micro light-emitting diode 110*a*1 and the first-type electrode 111 of the micro light-emitting diode 110*b*1 may be bonded to the common electrode line 130. However, the disclosure is not limited thereto. In the disclosure, it belongs the staggered manner mentioned in the disclosure as long as one of the micro light-emitting diode in the first transfer area S1 and the micro light-emitting diode in the second transfer area S2 is bonded to the top electrode 141 of the pixel electrode 140 while the other is bonded to the bottom electrode 142 of the pixel electrode 140.

In addition, the micro light-emitting diode 110*a*1 and the micro light-emitting diode 110*b*1 configured in the foregoing process are, for example, the first color light micro light-emitting diode. Accordingly, in the first direction D1, the first color light micro light-emitting diode located in one of the two transfer areas does not overlap with the first color light micro light-emitting diode located in the other one of the two transfer areas (this also belongs the staggered manner mentioned in the disclosure).

In an embodiment, the transfer head 10 may have a first edge 10*e*1 and a second edge 10*e*2 arranged side by side (e.g., arranged side by side in the first direction D1). In other words, the transfer head 10 may have the first edge 10*e*1 and the second edge 10*e*2 opposite to each other. More specifically, in the step S300 and the step 500, the first edge 10*e*1 may overlap with a boundary between one of the two transfer areas and the other one of the two transfer areas. For example, the first edge 10*e*1 may overlap with a boundary B between the first transfer area S1 and the second transfer area S2. In other words, the first edge 10*e*1 overlaps with the same position before or after the transfer head 10 is rotated.

In an embodiment, the rotation of the transfer head 10 is completed before or after the transfer head 10 is moved above the other one of the two transfer areas. More specifically, the transfer head 10 may be rotated first before the transfer head 10 is moved above the second transfer area S2 from the first transfer area S1. Alternatively, the transfer head 10 may be moved above the second transfer area S2 from the first transfer area S1 first, then the transfer head 10 is rotated.

Referring to FIG. 1, and FIG. 2C to FIG. 2F together, in this embodiment, the display substrate 120 may also have a third transfer area S3 and a fourth transfer area S4 respectively adjacent to the first transfer area S1 and the second transfer area S2 in the second direction D2. In addition, aforementioned the common electrode line 130 and the pixel electrodes 140 may be regarded as one group, and another group of the common electrode line 130 and the pixel electrodes 140 disposed on the display substrate 120 may be further included. Specifically, the common electrode line 130 in this another group of the common electrode line 130 and the pixel electrodes 140 may extend through the third transfer area S3 and the fourth transfer area S4 in the first direction D1, and the pixel electrodes 140 in this another group of the common electrode line 130 and the pixel electrodes 140 may be disposed in the third transfer area S3 and the fourth transfer area S4.

Figure 2D:
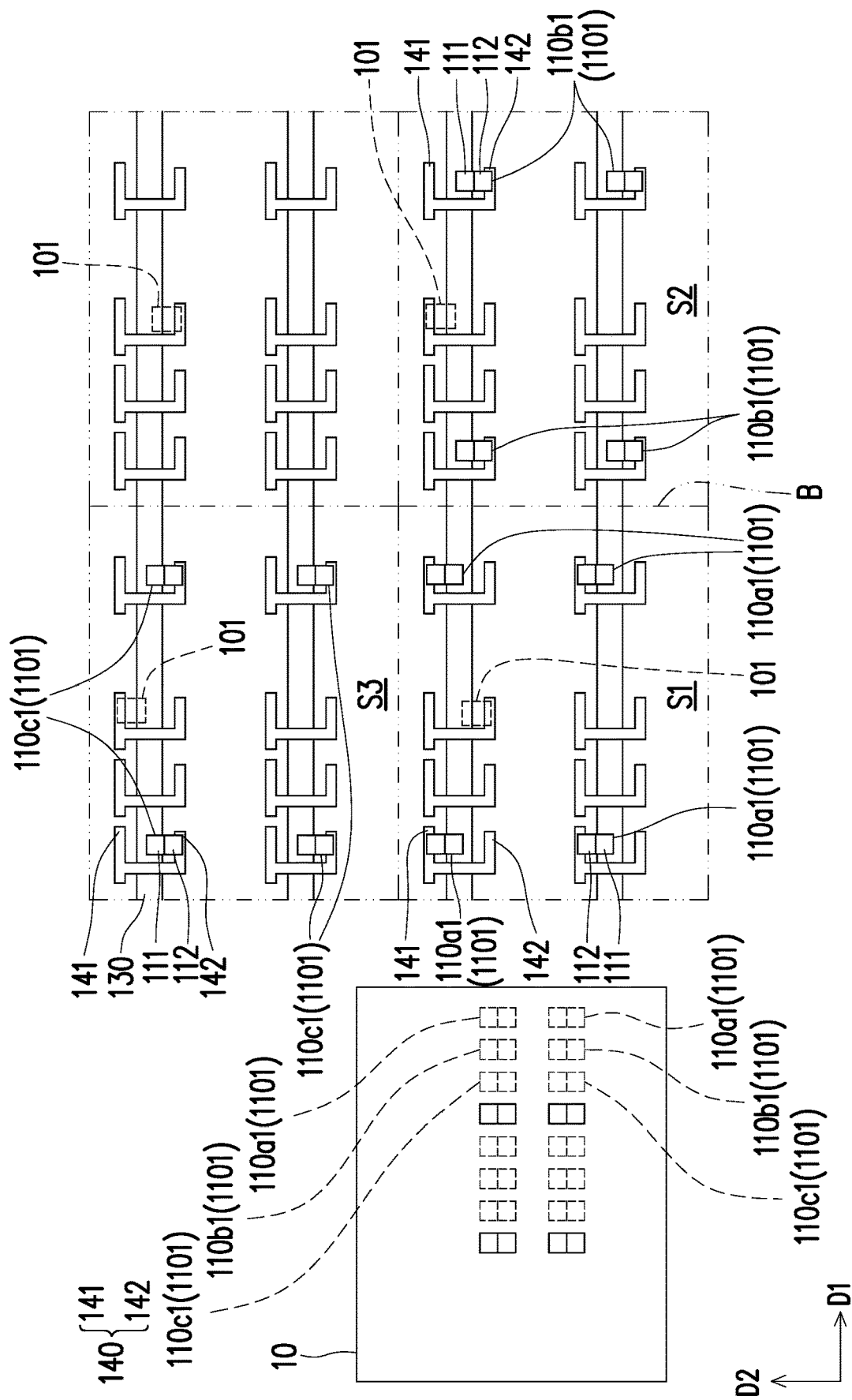
Figure 2E:
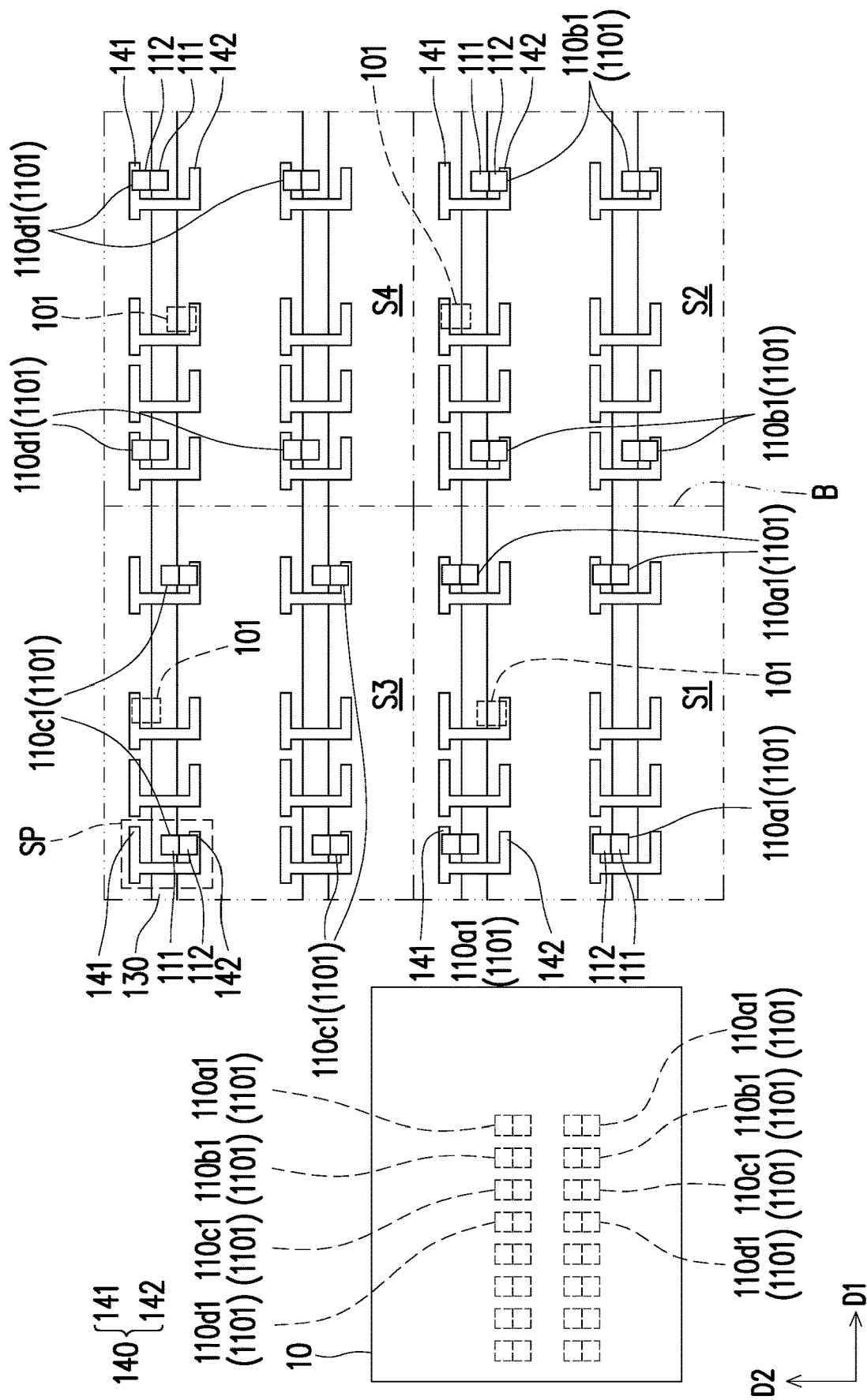
Figure 2F:
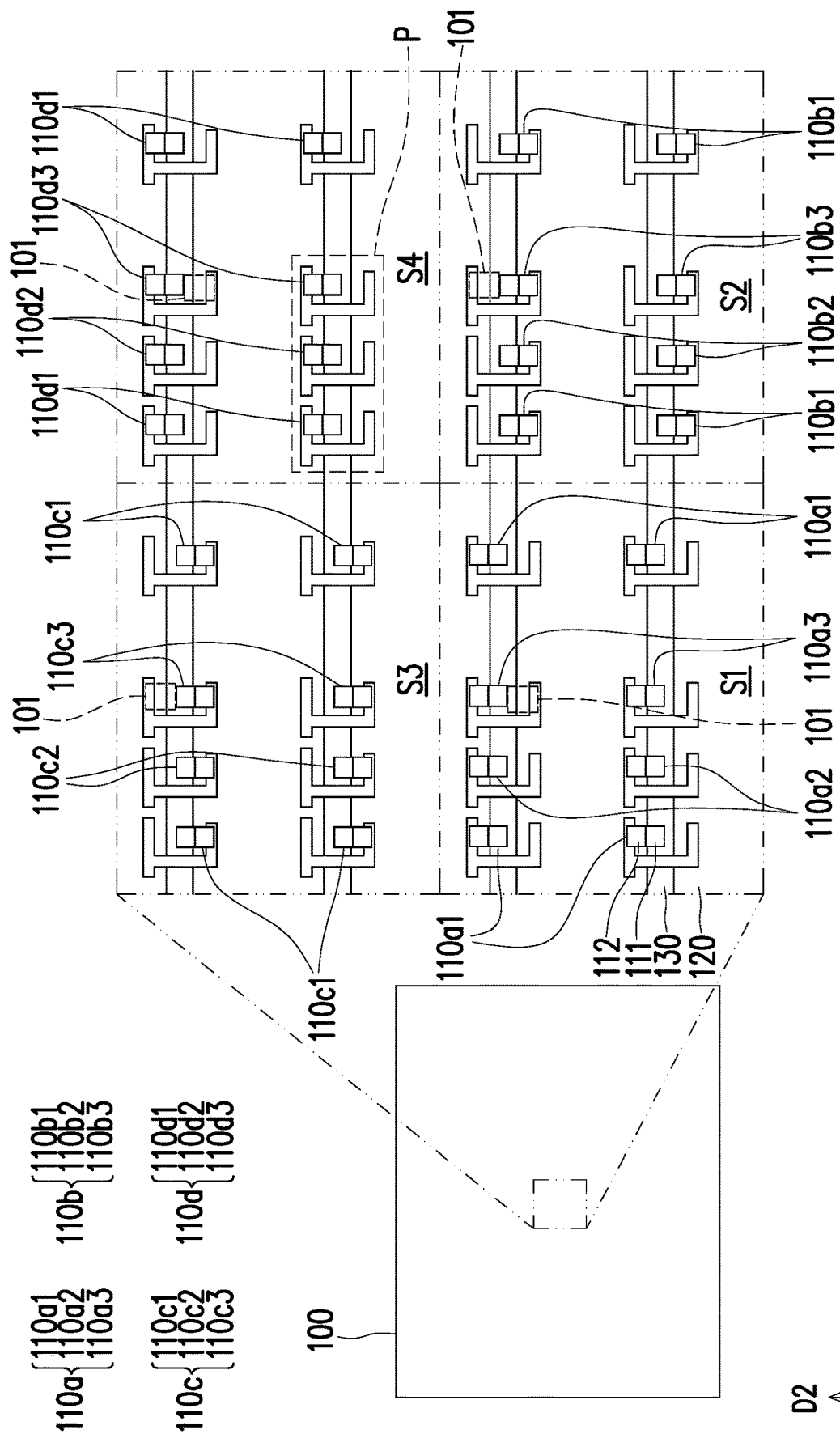

Then, the step S300 to the step S500 may be repeated to further dispose other micro light-emitting diodes 110*c*1 and micro light-emitting diodes 110*d*1 in the third transfer area S3 (as shown in FIG. 2D) and the fourth transfer area S4 (as shown in FIG. 2E) in sequence. Then, the transfer head 10 may be moved away from the fourth transfer area S4 (not shown). Accordingly, through the above process, the micro light-emitting diodes 1101 (the micro light-emitting diode 110*a*1, the micro light-emitting diode 110*b*1, the micro light-emitting diode 110*c*1 and the micro light-emitting diode 110*d*1) have been respectively disposed in the first transfer area S1, the second transfer area S2, the third transfer area S3 and the fourth transfer area S4 of the display substrate 120. In other words, the micro light-emitting diodes 1101 (the micro light-emitting diode 110*a*1, the micro light-emitting diode 110*b*1, the micro light-emitting diode 110*c*1 and the micro light-emitting diode 110*d*1) may respectively form sub-pixel areas SP in the first transfer area S1, the second transfer area S2, the third transfer area S3, and the fourth transfer area S4.

In an embodiment, an area of the transfer head 10 is equal to an area of any one of the transfer areas. For example, the area of the adsorption surface of the transfer head 10 may be equal to the area of any one of the first transfer area S1, the second transfer area S2, the third transfer area S3, and the fourth transfer area S4. However, the disclosure is not limited thereto. The area of the transfer head 10 may be adjusted according to actual requirement.

It should be noted that the disclosure is not limited to the numbers of transfer areas and micro light-emitting diodes, the number of transfers, a transfer order and a transfer direction in FIG. 2A to FIG. 2E. It belongs to the protection scope of the disclosure as long as the micro light-emitting diode located in one of the two transfer areas is staggered to the micro light-emitting diode located in the other of the two transfer areas. For example, in an embodiment not shown, the step S300 to the step S500 may be repeated to dispose one of the micro light-emitting diodes in the first transfer area S1, and dispose another one of the micro light-emitting diodes in the third transfer area S3 to form the mutual staggered manner.

Referring to FIG. 2F, the micro light-emitting diode 110*a*1, the micro light-emitting diode 110*b*1, the micro light-emitting diode 110*c*1 and the micro light-emitting diode 110*d*1 disposed in the foregoing process are, for example, the first color light micro light-emitting diode 110*a*1, the first color light micro light-emitting diode 110*b*1, the first color light micro light-emitting diode 110*c*1 and the first color light micro light-emitting diode 110*d*1. Therefore, the step S100 to the step S500 may be continuously repeated to dispose a second color light micro light-emitting diodes 110*a*2, a second color light micro light-emitting diodes 110*b*2, a second color light micro light-emitting diodes 110*c*2 and a second color light micro light-emitting diodes 110*d*2 respectively in the first transfer area S1, the second transfer area S2, the third transfer area S3 and the fourth transfer area S4 of the display substrate 120 in sequence.

Next, the step S100 to the step S500 are continuously repeated to dispose a third color light micro light-emitting diodes 110*a*3, a third color light micro light-emitting diodes 110*b*3, a third color light micro light-emitting diodes 110*c*3 and a third color light micro light-emitting diodes 110*d*3 respectively in the first transfer area S1, the second transfer area S2, the third transfer area S3 and the fourth transfer area S4 of the display substrate 120 in sequence, so that each of the transfer areas includes at least one of the first color light micro light-emitting diodes, at least one of the second color light micro light-emitting diodes and at least one of the third color light micro light-emitting diodes.

More specifically, the first color light micro light-emitting diode 110*a*1, the second color light micro light-emitting diode 110*a*2 and the third color light micro light-emitting diode 110*a*3 located in the first transfer area S1 may be arranged in a straight line along the first direction D1; the first color light micro light-emitting diode 110*b*1, the second color light micro light-emitting diode 110*b*2 and the third color light micro light-emitting diode 110*b*3 located in the second transfer area S2 may be arranged in another straight line along the first direction D1; the first color light micro light-emitting diode 110*c*1, the second color light micro light-emitting diode 110*c*2 and the third color light micro light-emitting diode 110*c*3 located in the third transfer area S3 may be arranged in another straight line along the first direction D1; the first color light micro light-emitting diode 110*d*1, the second color light micro light-emitting diode 110*d*2 and the third color light micro light-emitting diode 110*d*3 located in the fourth transfer area S4 may be arranged in another straight line along the first direction D1. The straight lines formed in two adjacent transfer areas are staggered to each other in the first direction D1. For example, the straight lines formed in the first transfer area S1 and the second transfer area S2 are staggered to each other in the first direction D1; the straight lines formed in the third transfer area S3 and the fourth transfer area S4 are staggered to each other in the first direction D1.

Accordingly, the micro light-emitting diode 110*a*1, the micro light-emitting diode 110*a*2, and the micro light-emitting diode 110*a*3 in the first transfer area S1 can constitute a first micro light-emitting element 110*a*; the micro light-emitting diode 110*b*1, the micro light-emitting diode 110*b*2, and the micro light-emitting diode 110*b*3 in the second transfer area S2 can constitute a second micro light-emitting element 110*b*; the micro light-emitting diode 110*c*1, the micro light-emitting diode 110*c*2, and the micro light-emitting diode 110*c*3 in the third transfer area S3 can constitute a third micro light-emitting element 110*c*; and the micro light-emitting diode 110*d*1, the micro light-emitting diode 110*d*2, and the micro light-emitting diode 110*d*3 in the fourth transfer area S2 can constitute a fourth micro light-emitting element 110*d*. Therefore, the first transfer area S1, the second transfer area S2, the third transfer area S3 and the fourth transfer area S4 can form a plurality of pixel areas P, respectively.

In the first direction D1, the micro light-emitting elements (e.g., the first micro light-emitting element 110*a* and the second micro light-emitting element 11*b*) in the two adjacent transfer areas (e.g., the first transfer area S1 and the second transfer area S2) have a same color light. Furthermore, both the first micro light-emitting element 110*a* and the second micro light-emitting element 110*b* include at least three micro light-emitting diodes of different colors, In the first direction D1, an order of the three micro light-emitting diodes of different colors of the first micro light-emitting element 110*a* is consistent with an order of the three micro light-emitting diodes of different colors of the second micro light-emitting element 110*b*.

Referring to FIG. 2F, in this embodiment, the micro LED display device 100 includes the display substrate 120. The display substrate 120 has the first transfer area S1 and the second transfer area S2 adjacent to each other. Both the first transfer area S1 and the second transfer area S2 include the pixel areas P. The first micro light-emitting elements 100*a* are arranged in a straight line along the first direction D1. The second micro light-emitting elements 100*b* are arranged in another straight line along the first direction D1. In the first direction D1, the first micro light-emitting element 110*a* and the second micro light-emitting element 110*b* are arranged in a staggered manner. Accordingly, the brightness difference between adjacent transfer areas (e.g., the first transfer area S1 and the second transfer area S2) may be compensated. Therefore, the display substrate 120 can have good display quality when working.

More specifically, both the first micro light-emitting element 110*a* and the second micro light-emitting element 110*b* may include the first-type electrode 111 and the second-type electrode 112, and the first-type electrode 111 of the first micro light-emitting element 110*a* and the first-type electrode 111 of the second micro light-emitting element 110*b* are bonded to the common electrode line 130. In addition, two ends of the first micro light-emitting element 110*a* (the first-type electrode 111 and the second-type electrode 112) may be respectively bonded to the common electrode line 130 and the top electrode 141 of the pixel electrode 140 in the first transfer area S1, and In addition, two ends of the second micro light-emitting element 110*b* (the first-type electrode 111 and the second-type electrode 112) may be respectively bonded to the common electrode line 130 and the bottom electrode 142 of the pixel electrode 140 in the second transfer area S2.

Referring to FIG. 2A to FIG. 2F, if the micro light-emitting diode is bonded to the common electrode line 130 and the top electrode 141 of the pixel electrode 140, the bottom electrode 142 of the same pixel electrode 140 serves as a repair area 101. Once the existing micro light-emitting diode is found to be damaged after inspection, another micro light-emitting diode of the same color light may be transferred onto the repair area 101, and that micro light-emitting diode may be bonded with the common electrode line 130 and the bottom electrode 142 of the same pixel electrode 140. Conversely, if the micro light-emitting diode is bonded to the common electrode line 130 and the bottom electrode 142 of the pixel electrode 140, the top electrode 141 of the same pixel electrode 140 serves as the repair area 101. Once the existing micro light-emitting diode is found to be damaged after inspection, another micro light-emitting diode of the same color light may be transferred onto the repair area 101, and that micro light-emitting diode may be bonded with the common electrode line 130 and the top electrode 141 of the same pixel electrode 140. However, the disclosure is not limited thereto. The micro light-emitting diodes may also be repaired by other suitable methods.

Figure 3:
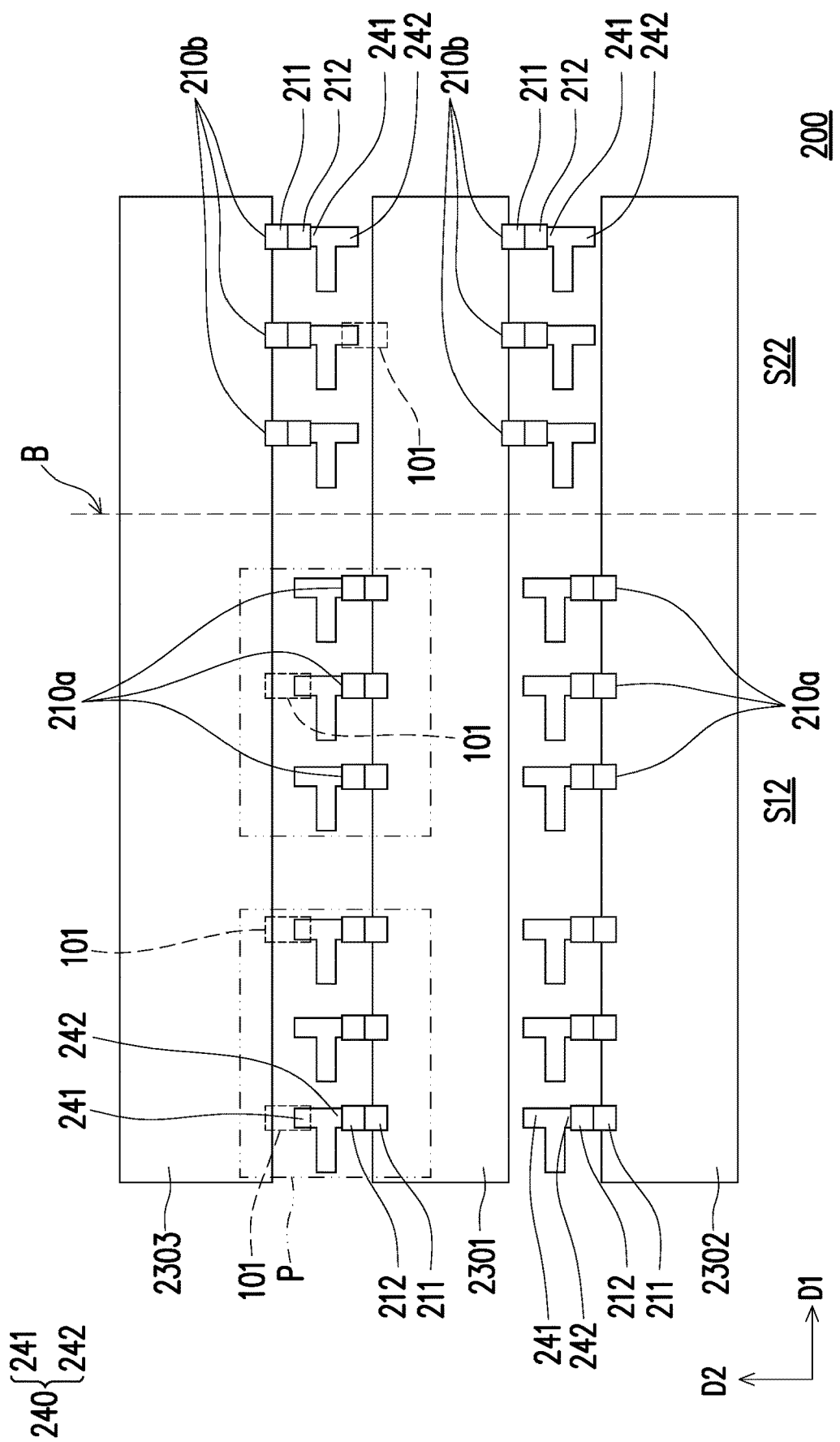
FIG. 3 is a partial schematic diagram illustrating a micro LED display device according to another embodiment of the disclosure.

FIG. 3 is a partial schematic diagram illustrating a micro LED display device according to another embodiment of the disclosure. Referring to FIG. 3, compared with the micro LED display device 100, a micro LED display device 200 of this embodiment includes a first common electrode line 2301 and a second common electrode line 2302 and a plurality of pixel electrodes 240 disposed on the display substrate 120. The first common electrode line 2301 is parallel to the second common electrode line 2302. The first common electrode line 2301 and the second common electrode line 2302 extend through a first transfer area S12 and a second transfer area S22 along the first direction D1. The pixel electrodes 240 may be disposed in an array in the first transfer area S12 and the second transfer area S22. Each of the pixel electrodes 240 is located between the first common electrode line 2301 and the second common electrode line 2302, and each of the pixel electrodes 240 may include a top electrode 241 extending toward the first common electrode line 2301 and a bottom electrode 242 extending toward the second common electrode line 2302.

Further, two ends of a first micro light-emitting element 210*a* (a first-type electrode 211 and a second-type electrode 212) may be respectively bonded to the second common electrode line 2302 and the bottom electrode 242 of the pixel electrode 240 in the first transfer area S12, and two ends of the second micro light-emitting element 210b (the first-type electrode 211 and the second-type electrode 212) may be respectively bonded to the first common electrode line 2301 and the top electrode 241 of the pixel electrode 240 in the second transfer area S22. The first common electrode line 2301 and the second common electrode line 2302 may be arranged along the second direction D2, but the disclosure is not limited thereto.

Further, in this embodiment, as shown in FIG. 3, the micro LED display device 200 may further include a third common electrode line 2303 and the other pixel electrodes 240 disposed on the display substrate 120. For example, the third common electrode line 2303, the first common electrode line 2301 and the second common electrode line 2302 may be arranged along the second direction D2; two ends of another first micro light-emitting element 210a (the first-type electrode 211 and the second-type electrode 212) may be respectively bonded to the first common electrode line 2301 and the bottom electrode 242 of the other pixel electrode 240 in the first transfer area S12; and two ends of the second micro light-emitting element 210b (the first-type electrode 211 and the second-type electrode 212) may be respectively bonded to the third common electrode line 2303 and the top electrode 241 of the other pixel electrode 240 in the second transfer area S22. However, the disclosure is not limited thereto.

Figure 4:
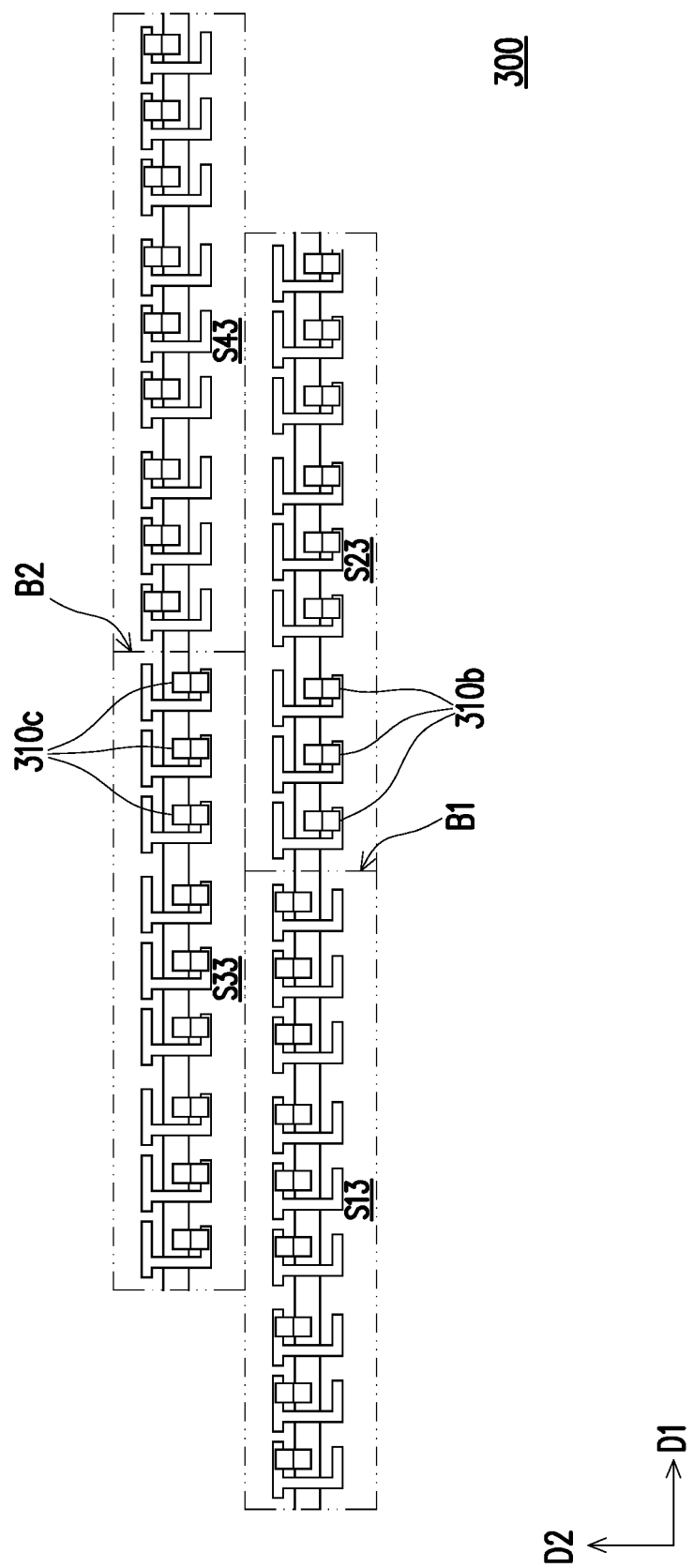
FIG. 4 is a partial schematic diagram illustrating a micro LED display device according to yet another embodiment of the disclosure.

FIG. 4 is a partial schematic diagram illustrating a micro LED display device according to yet another embodiment of the disclosure. Referring to FIG. 4, compared with the micro LED display device 100, a boundary B2 between a third transfer area S33 and a fourth transfer area S43 of a micro LED display device 300 of this embodiment is offset from a boundary B1 between a first transfer area S13 and a second transfer area S23 in the first direction D1. Furthermore, a third micro light-emitting element 310c in the third transfer area S33 may be aligned with a second micro light-emitting element 310b in the second transfer area S22 in the second direction D2. The second micro light-emitting element 310b and the third micro light-emitting element 310c may be plural in numbers (three are schematically shown in FIG. 4). In this embodiment, one of the third micro light-emitting elements 310c may be aligned with one of the second micro light-emitting elements 310b in the second direction D2. In other words, the second transfer area S23 and the third transfer area S33 may both include a plurality of pixel areas, and one of the pixel areas in the second transfer area S23 may be aligned with one of the pixel areas in the third transfer area S33 in the second direction D2. Here, the alignment can be one-to-one.

Figure 5:
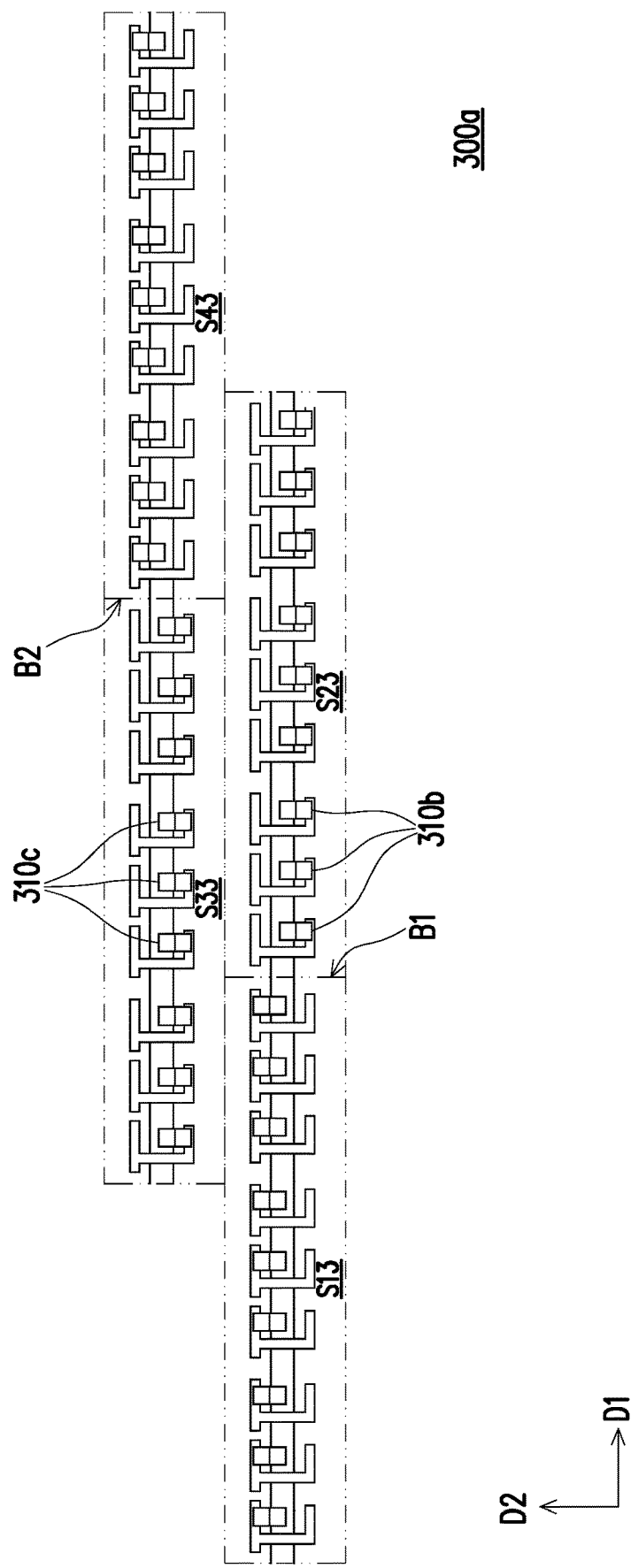
FIG. 5 is a partial schematic diagram illustrating a micro LED display device according to still another embodiment of the disclosure.

FIG. 5 is a partial schematic diagram illustrating a micro LED display device according to still another embodiment of the disclosure. Referring to FIG. 5, compared with the micro LED display device 300, a micro LED display device 300a of this embodiment has a larger offset. In other words, two of the third micro light-emitting elements 310c may be aligned with two of the second micro light-emitting elements 310b in the second direction D2. In other words, two of the pixel areas in the second transfer area S23 may be aligned with two of the pixel areas in the third transfer area S33 in the second direction D2.

It should be noted that the disclosure does not limit the number of the third micro light-emitting elements 310c aligned with the second micro light-emitting elements 310b in the second direction D2 or the number of the pixel areas in the second transfer area S23 aligned with the pixel areas in the third transfer area S33 in the second direction D2. The number of those aligned may be determined according to the design requirements of the offset. For example, the number of those aligned may be greater than two.

Figure 6:
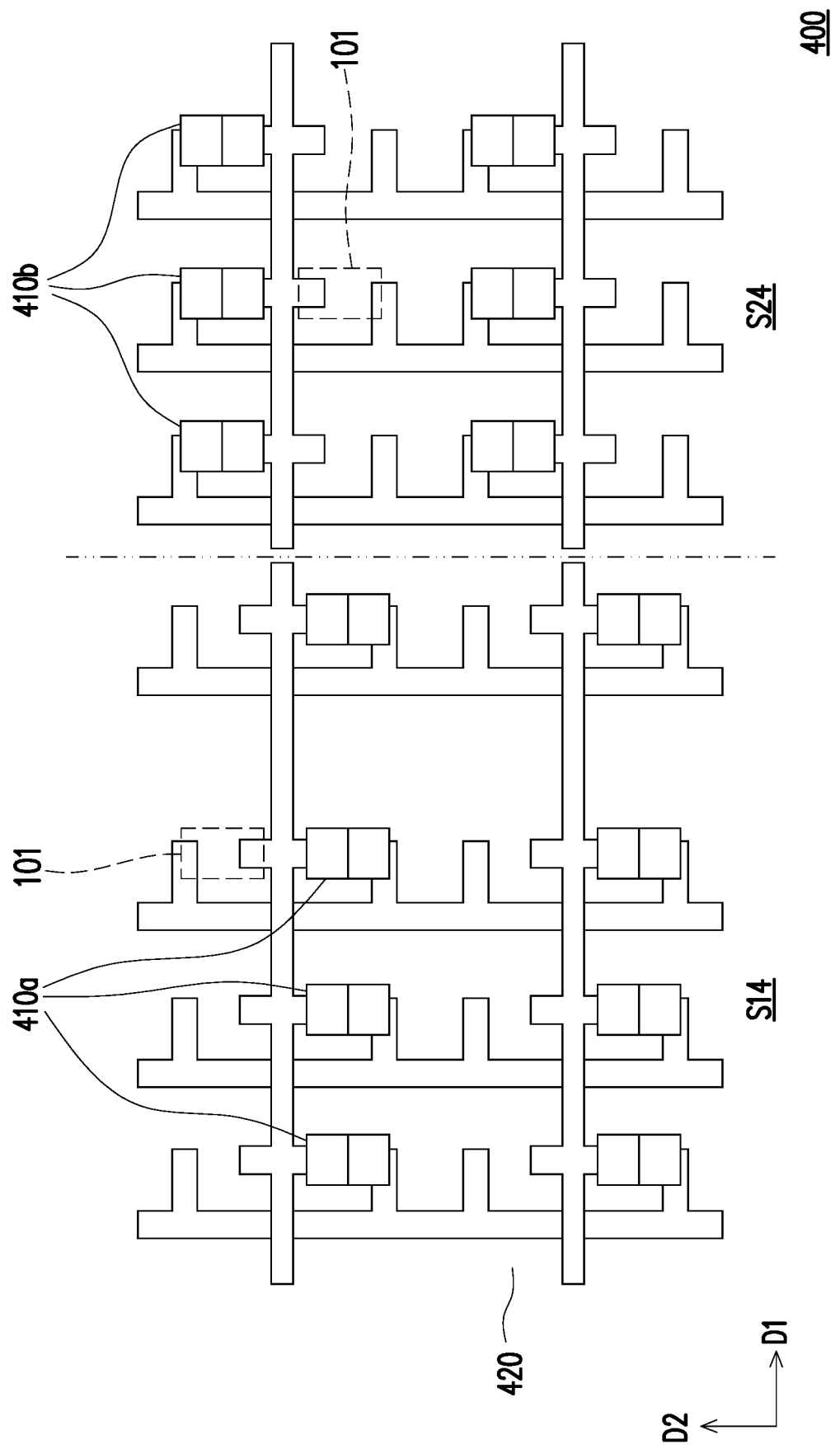
FIG. 6 is a partial schematic diagram illustrating a micro LED display device according to yet another embodiment of the disclosure.

FIG. 6 is a partial schematic diagram illustrating a micro LED display device according to yet another embodiment of the disclosure. Referring to FIG. 6, a micro LED display device 400 of this embodiment can be applied to a passive matrix mode (PM mode). In this embodiment, the micro LED display device 400 may include a display substrate 420, a first micro light-emitting element 410a and a second micro light-emitting element 410b. The display substrate 420 has a first transfer area S14 and a second transfer area S24 adjacent to each other. The first micro light-emitting elements 410a are disposed in the first transfer area S14, and arranged in a straight line along the first direction D1. The second micro light-emitting elements 410b are disposed in the second transfer area S24, and arranged in another straight line along the first direction D1. In the first direction D1, the first micro light-emitting element 410a does not overlap with the second micro light-emitting element 410b. Accordingly, the brightness difference between adjacent transfer areas (e.g., the first transfer area S14 and the second transfer area S24) may be compensated. Therefore, the display substrate 420 can have good display quality when working.

In summary, according to the transfer steps of the disclosure, by rotating the transfer head 180 degrees when the transfer head is moved from one transfer area to another transfer area, the micro light-emitting diodes may be transferred onto the predetermined positions more accurately to form the mutual staggered manner. In this way, the obvious boundary caused by the thickness difference of the micro light-emitting diodes at both ends of the transfer head due to the wafer process factors may be reduced, and the brightness difference between the adjacent transfer areas may be compensated. Therefore, the display substrate can provide good display quality when working.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A micro LED display device, comprising:
a display substrate, having a first transfer area and a second transfer area adjacent to each other, both the first transfer area and the second transfer area comprise a plurality of pixel areas, wherein:
at least one of the pixel areas in the first transfer area comprises a first micro light-emitting element arranged in a straight line along a first direction;
at least one of the pixel areas in the second transfer area comprises a second micro light-emitting element arranged in another straight line along the first direction, wherein the first micro light-emitting element and the second micro light-emitting element have a same color light;
a plurality of pixel electrodes, disposed in the first transfer area and the second transfer area, wherein each of the pixel electrodes comprises a top electrode and a bottom electrode in a second direction perpendicular to the first direction, the first micro light-emitting element in the first transfer area and the second micro light-emitting element in the second transfer area is bonded to the top electrode of the pixel electrodes while the other is bonded to the bottom electrode of the pixel electrodes; and a common electrode line, disposed between the top electrode and the bottom electrode, and extending through the first transfer area and the second transfer area along the first direction, wherein the first micro light-emitting element is bonded to the top electrode and the common electrode line, and the second micro light-emitting element is bonded to the bottom electrode and the common electrode line.

2. The micro LED display device of claim 1, wherein the top electrode and the bottom electrode are located on two sides of the common electrode line.

3. The micro LED display device of claim 2, wherein two ends of the first micro light-emitting element are respectively bonded to the common electrode line and the top electrode of the pixel electrode in the first transfer area, and two ends of the second micro light-emitting element are respectively bonded to the common electrode line and the bottom electrode of the pixel electrode in the second transfer area.

4. The micro LED display device of claim 1, further comprising a first common electrode line, a second common electrode line, wherein the first common electrode line is parallel to the second common electrode line, the first common electrode line and the second common electrode line extend through the first transfer area and the second transfer area along the first direction, and the plurality of pixel electrodes are disposed in an array in the first transfer area and the second transfer area, wherein each of the pixel electrodes is located between the first common electrode line and the second common electrode line, and each of the pixel electrodes comprises a top electrode extending toward the first common electrode line and a bottom electrode extending toward the second common electrode line.

5. The micro LED display device of claim 4, wherein two ends of the first micro light-emitting element are respectively bonded to the second common electrode line and the bottom electrode of the pixel electrodes in the first transfer area, and two ends of the second micro light-emitting element are respectively bonded to the first common electrode line and the top electrode of the pixel electrodes in the second transfer area.

6. The micro LED display device of claim 4, wherein the first common electrode line and the second common electrode line are arranged along a second direction perpendicular to the first direction.

7. The micro LED display device of claim 1, wherein the display substrate further comprises a third transfer area and a fourth transfer area respectively adjacent to the first transfer area and the second transfer area in a second direction perpendicular to the first direction, and a boundary between the third transfer area and the fourth transfer area is offset from a boundary between the first transfer area and the second transfer area in the first direction.

8. The micro LED display device of claim 7, wherein the third transfer area comprises a third micro light-emitting element, and the third micro light-emitting element is aligned with the second micro light-emitting element in the second direction.

9. The micro LED display device of claim 8, wherein the second micro light-emitting element and the third micro light-emitting element are plural in numbers, and at least one of the third micro light-emitting elements is aligned with at least one of the second micro light-emitting elements in the second direction.

10. The micro LED display device of claim 9, wherein the third transfer area comprises a plurality of pixel areas, and at least one of the pixel areas in the second transfer area is aligned with at least one of the pixel areas in the third transfer area in the second direction.

* * * * *